United States Patent
Kim et al.

(10) Patent No.: US 9,941,474 B2
(45) Date of Patent: Apr. 10, 2018

(54) METHOD OF MANUFACTURING ORGANIC LIGHT-EMITTING DIODE DISPLAY

(71) Applicant: Samsung Display Co., Ltd., Yongin-si, Gyeonggi-do (KR)

(72) Inventors: Sunho Kim, Yongin-si (KR); Hyunwoo Koo, Yongin-si (KR); Kihyun Kim, Yongin-si (KR); Jeongho Kim, Yongin-si (KR); Taewoong Kim, Yongin-si (KR); Yeongon Mo, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 64 days.

(21) Appl. No.: 14/849,371

(22) Filed: Sep. 9, 2015

(65) Prior Publication Data
US 2016/0190523 A1    Jun. 30, 2016

(30) Foreign Application Priority Data
Dec. 31, 2014   (KR) ........................ 10-2014-0195087

(51) Int. Cl.
| H01L 51/56 | (2006.01) |
| H01L 27/32 | (2006.01) |
| H01L 51/00 | (2006.01) |
| H01L 51/52 | (2006.01) |

(52) U.S. Cl.
CPC .......... *H01L 51/003* (2013.01); *H01L 27/323* (2013.01); *H01L 51/5253* (2013.01); *H01L 51/56* (2013.01); *H01L 2227/323* (2013.01); *H01L 2227/326* (2013.01)

(58) Field of Classification Search
CPC ... H01L 51/003; H01L 51/56; H01L 51/0024; H01L 51/0096; H01L 51/5237; H01L 51/524; H01L 51/5253; H01L 51/5256
See application file for complete search history.

(56) References Cited

U.S. PATENT DOCUMENTS

| 6,071,784 | A | * | 6/2000 | Mehta | ............... H01L 21/76801 257/E21.576 |
| 2002/0003403 | A1 | | 1/2002 | Ghosh et al. | |
| 2003/0082889 | A1 | * | 5/2003 | Maruyama | .......... H01L 27/1214 438/455 |

(Continued)

FOREIGN PATENT DOCUMENTS

| KR | 10-2013-0117112 A | 10/2013 |
| KR | 10-2014-0012593 A | 2/2014 |
| KR | 10-2014-0059376 A | 5/2014 |

*Primary Examiner* — Robert Bachner
*Assistant Examiner* — Molly Reida
(74) *Attorney, Agent, or Firm* — Knobbe, Martens, Olson & Bear, LLP

(57) ABSTRACT

A method of manufacturing an OLED display is disclosed. In one aspect, the method includes providing a donor substrate including a material formed on one surface thereof and heating the material so as to form a barrier thin-film on the donor substrate. The method also includes providing an acceptor substrate and a substrate attached to the acceptor substrate, forming an OLED unit over the substrate, bonding the OLED unit and the barrier thin-film together, and irradiating a laser beam on the barrier thin-film so as to delaminate the donor substrate from the barrier thin-film.

14 Claims, 23 Drawing Sheets

(56) References Cited

U.S. PATENT DOCUMENTS

| | | | |
|---|---|---|---|
| 2003/0150107 A1* | 8/2003 | Cropper | G06F 3/045 |
| | | | 29/832 |
| 2005/0112874 A1* | 5/2005 | Skarp | C23C 16/403 |
| | | | 438/680 |
| 2006/0084205 A1* | 4/2006 | Kodaira | H01L 27/1214 |
| | | | 438/149 |
| 2008/0001864 A1* | 1/2008 | Lee | H01L 27/3253 |
| | | | 345/82 |
| 2012/0181923 A1* | 7/2012 | Cho | H01L 27/323 |
| | | | 313/512 |
| 2012/0305981 A1* | 12/2012 | Park | H01L 51/5253 |
| | | | 257/100 |
| 2014/0127843 A1 | 5/2014 | Lee et al. | |
| 2014/0291621 A1* | 10/2014 | Kim | H01L 51/5237 |
| | | | 257/40 |

* cited by examiner

METHOD OF MANUFACTURING ORGANIC LIGHT-EMITTING DIODE DISPLAY

INCORPORATION BY REFERENCE TO ANY PRIORITY APPLICATIONS

This application claims the benefit of Korean Patent Application No. 10-2014-0195087, filed on Dec. 31, 2014, in the Korean Intellectual Property Office, the disclosure of which is incorporated herein in its entirety by reference.

BACKGROUND

Field

The described technology generally relates to a method of manufacturing an organic light-emitting diode display.

Description of the Related Technology

Each pixel of an organic light-emitting diode (OLED) display includes a hole injection electrode, an electron injection electrode, and an organic emission layer formed between the hole injection electrode and the electron injection electrode. An OLED emits light when excitons generated by recombining holes injected from the hole injection electrode and electrons injected from the electron injection electrode in the organic emission layer drop from an excited state to a ground state.

As OLED displays have self-emitting characteristics, they do not require a separate light source. Thus, they can be driven at a low voltage, can be formed to be lightweight and thin, and have favorable characteristics such as wide view angles, good contrast, and quick response times. Accordingly, this technology has drawn attention for use in next-generation displays.

SUMMARY OF CERTAIN INVENTIVE ASPECTS

One inventive aspect relates to a method of manufacturing an OLED display.

Another aspect is a method of manufacturing an OLED display that includes: preparing donor glass; evaporating a material to form a barrier thin-film on the donor glass through a high-temperature process; preparing acceptor glass having a lower substrate thereon; providing an organic light-emitting device (OLED) unit on the lower substrate; turning over the donor glass and bonding the donor glass to the acceptor glass; and irradiating a laser beam on the barrier thin-film to delaminate the donor glass from the barrier thin-film.

The method can further include forming a sacrificial layer on the donor glass before the evaporating of a material to form the barrier thin-film.

The sacrificial layer can be formed of a material which is not disintegrated at a temperature of 550° C. or less.

The sacrificial layer can be formed of an inorganic material containing hydrogen of 4 wt % or more.

The sacrificial layer can be formed of an oxide, a nitride, a dielectric, or a semiconductor.

The barrier thin-film can be a high-density thin layer formed by a high-temperature process.

The barrier thin-film can be an inorganic single layer, an inorganic multi-layer, or an organic and inorganic multi-layer.

The method can further include forming a buffer layer on an OLED after providing the OLED on the lower substrate.

The donor glass can be delaminated from the barrier thin-film by irradiating a laser beam on the sacrificial layer.

The method can further include attaching an upper protective film on the barrier thin-film after delaminating the donor glass from the barrier thin-film.

The method can further include turning over the acceptor glass and delaminating the acceptor glass by irradiating a laser beam thereon, after delaminating the donor glass from the barrier thin-film.

The method can further include attaching a lower protective film below the lower substrate after delaminating the acceptor glass.

The method can further include sequentially attaching a pol film, a TSP, and a window onto the barrier thin-film after removing the upper protective film attached to the barrier thin-film.

The bonding of the donor glass to the acceptor glass can be performed by aligning and firmly bonding the donor glass to the acceptor glass in a vacuum environment.

Another aspect is a method of manufacturing an organic light-emitting diode (OLED) display, the method comprising: providing a donor substrate including a material formed on one surface thereof; heating the material so as to form a barrier thin-film on the donor substrate; providing an acceptor substrate and a substrate attached to the acceptor substrate; forming an OLED unit over the substrate; bonding the OLED unit and the barrier thin-film together; and irradiating a laser beam on the barrier thin-film so as to delaminate the donor substrate from the barrier thin-film.

The above method further comprises forming a sacrificial layer over the donor substrate before the heating.

In the above method, the sacrificial layer is formed of a material which is not disintegrated at a temperature of about 550° C. or less.

In the above method, the sacrificial layer is formed of an inorganic material including hydrogen of about 4 wt % or more.

In the above method, the sacrificial layer is formed of an oxide, a nitride, a dielectric, or a semiconductor.

In the above method, the barrier thin-film has a thickness substantially the same as the sacrificial layer.

In the above method, the barrier thin-film includes an inorganic single layer, an inorganic multi-layer, or an organic and inorganic multi-layer.

The above method further comprises forming a buffer layer over the OLED unit after forming the OLED unit over the substrate.

The above method further comprises attaching an upper protective film on the barrier thin-film after the irradiating.

The above method further comprises: removing the upper protective film from the barrier thin-film; and sequentially attaching a polarizing film, a touch screen panel (TSP), and a window onto the barrier thin-film film.

The above method further comprises irradiating a laser beam on the substrate so as to delaminate the acceptor substrate from the substrate after delaminating the donor substrate from the barrier thin-film.

The above method further comprises attaching a protective film to the substrate after delaminating the acceptor substrate.

In the above method, the bonding includes aligning the donor substrate to the acceptor substrate and performing the bonding in a vacuum environment.

Another aspect is a method of manufacturing an organic light-emitting diode (OLED) display, the method comprising: forming a barrier thin-film on a donor substrate so as to form a donor portion; attaching an intermediate substrate to an acceptor substrate so as to form an acceptor portion; forming an OLED unit over the intermediate substrate;

bonding the OLED unit and the barrier thin-film together so as to attach the acceptor portion to the donor portion; and delaminating the donor substrate from the barrier thin-film.

In the above method, the forming includes heating a material formed on the donor substrate so as to form the barrier thin-film.

The above method further comprises attaching an upper protective film on the barrier thin-film after delaminating the donor substrate from the barrier thin-film.

The above method further comprises: removing the upper protective film from the barrier thin-film; and sequentially attaching a polarizing film, a touch screen panel (TSP), and a window onto the barrier thin-film film.

The above method further comprises irradiating a laser beam on the intermediate substrate so as to delaminate the acceptor substrate from the intermediate substrate after delaminating the donor substrate from the barrier thin-film.

The above method further comprises attaching a lower protective film to the intermediate substrate after delaminating the acceptor substrate.

In the above method, the bonding includes aligning the donor substrate to the acceptor substrate and performing the bonding in a vacuum environment.

DETAILED DESCRIPTION OF CERTAIN INVENTIVE EMBODIMENTS

Figure 1A:
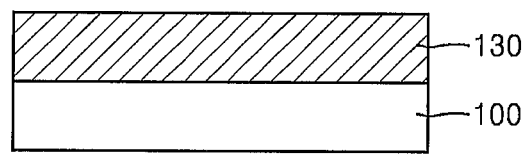
FIGS. 1A, 1B, 1C, 1D and 1E illustrate cross-sectional views of an OLED display manufactured by a method of manufacturing the OLED display, according to an embodiment.

Reference will now be made in detail to exemplary embodiments, examples of which are illustrated in the accompanying drawings, wherein like reference numerals refer to like elements throughout. In this regard, the present exemplary embodiments can have different forms and should not be construed as being limited to the descriptions set forth herein. Accordingly, the exemplary embodiments are merely described below, by referring to the figures, to explain aspects of the present description.

It will be understood that although the terms "first", "second", etc. can be used herein to describe various components, these components should not be limited by these terms. These components are only used to distinguish one component from another, As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components can be present.

Sizes of elements in the drawings can be exaggerated for convenience of explanation. In other words, since sizes and thicknesses of components in the drawings are arbitrarily illustrated for convenience of explanation, the following embodiments are not limited thereto.

When a certain embodiment can be implemented differently, a specific process order can be performed differently from the described order. For example, two consecutively described processes can be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art. Moreover, "formed on" can also mean "formed over." The term "connected" can include an electrical connection.

FIGS. 1A to 1E illustrate cross-sectional views of an OLED display manufactured by a method of manufacturing the OLED display, according to an embodiment.

Referring to FIG. 1A, a donor glass 100 is first prepared, and a barrier thin-film 130 is formed on the donor glass 100.

The donor glass 100 can be a transparent glass substrate. However, the present embodiment is not limited thereto, and a substrate of various materials can be used.

The barrier thin-film 130 can be an inorganic layer or an organic layer or can have a multi-thin-film-layer structure in which the organic layer and the inorganic layer are alternately stacked.

That is, the barrier thin-film 130 can be a single inorganic layer, a multi-inorganic-thin-film layer in which a plurality of inorganic layers are stacked, a single organic layer, or a multi-organic-thin-film layer in which a plurality of organic layers are stacked.

When an organic layer and an inorganic layer are alternately stacked, the number of thin-film layers can vary according to the designed implementation.

In this case, the inorganic layer can firmly prevent infiltration of oxygen and moisture, and the organic layer can absorb stress of the inorganic layer to exhibit flexibility.

The inorganic layer can be a single layer or a stack layer formed of a metal oxide or a metal nitride. For example, the inorganic layer is formed of silicon nitride ($SiN_x$), aluminum oxide ($Al_2O_3$), silicon oxide ($SiO_2$), or titanium oxide ($TiO_2$).

The organic layer can be formed of a polymer and can be a single layer or a stack layer formed of polyethylene terephthalate (PET), polyimide (PI), polycarbonate (PC), epoxy, polyethylene, or polyacrylate. For example, the organic layer is formed of polyacrylate. For example, the organic layer is formed of a polymer of a monomer composition including a diacrylate monomer and a triacrylate monomer. The monomer composition can further include a photoinitiator such as thermoplastic polyolefin (TPO) but is not limited thereto.

In the method of manufacturing the OLED display according to an embodiment, a process of evaporating a material to form the barrier thin-film 130 can be performed in a high-temperature environment.

Commonly, a barrier thin-film of an OLED display can be formed on an OLED to prevent infiltration of external oxygen or moisture and to exhibit flexibility after forming the OLED.

Typically, a process of evaporating or heating a material or unheated material to form the barrier thin-film is not performed at a high temperature of about 80° C. or more because an organic material of the OLED is damaged at a high temperature. Therefore, a process of forming an OLED and evaporating a material to form a barrier thin-film on the OLED is typically performed at a low temperature of about 80° C. or less.

Typically, since a process of evaporating a material to form a barrier thin-film is not performed in a high-temperature environment, a density of the barrier thin-film formed by evaporating a material in a low-temperature environment is low.

When a density of a barrier thin-film is low, a function of preventing infiltration of external oxygen or moisture deteriorates, and thus, the barrier thin-film has to be thick to prevent damage of an OLED due to oxygen/moisture.

For example, even with an inorganic layer having a thickness of about 10000 Å or more, an OLED is damaged due to infiltration of oxygen/moisture, and thus, reliability is not satisfied.

As a result, a barrier thin-film is formed with a large thickness, and the flexibility of an OLED display decreases according to the large thickness of the barrier thin-film.

Accordingly, cracks can occur when the OLED display is repeatedly curved or bent, and thus, it is difficult to use the OLED display as a flexible display.

However, in the method of manufacturing the OLED display according to the present embodiment, the barrier thin-film 130 is separately formed by evaporating a material on the donor glass 100 instead of being formed on an OLED, and thus, the barrier thin-film 130 can be formed by evaporating a material in a high-temperature process.

When the barrier thin-film 130 is formed by evaporating a material in a high-temperature process of about 80° C. or more, a density of the barrier thin-film 130 can be high, thereby improving a function of preventing infiltration of moisture or oxygen.

Accordingly, since the barrier thin-film 130, which is formed by evaporation of a material, according to the present embodiment, sufficiently prevents the infiltration of moisture even without a great thickness, the barrier thin-film 130 can be formed with a small thickness, and both moisture infiltration prevention efficiency and flexibility can increase, and thus, the OLED display according to the present embodiment can be used as a flexible display.

Figure 1B:
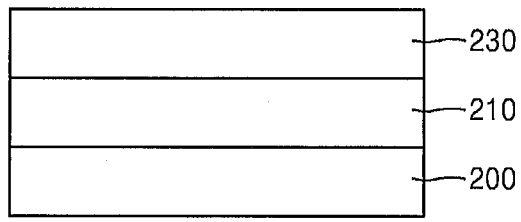

Referring to FIG. 1B, an acceptor glass 200 is prepared separately from the donor glass 100. The acceptor glass 200 can have a lower substrate or an intermediate substrate 210 formed thereon.

The acceptor glass 200 can be formed of the same material as that of the donor glass 100, but is not limited thereto.

The lower substrate 210 can be formed of a plastic material having strong heat-resistance characteristics, e.g., PI. However, a material of the lower substrate 210 is not limited thereto, and various materials can be used.

An OLED unit 230 can be provided on the lower substrate 210.

Figure 2:
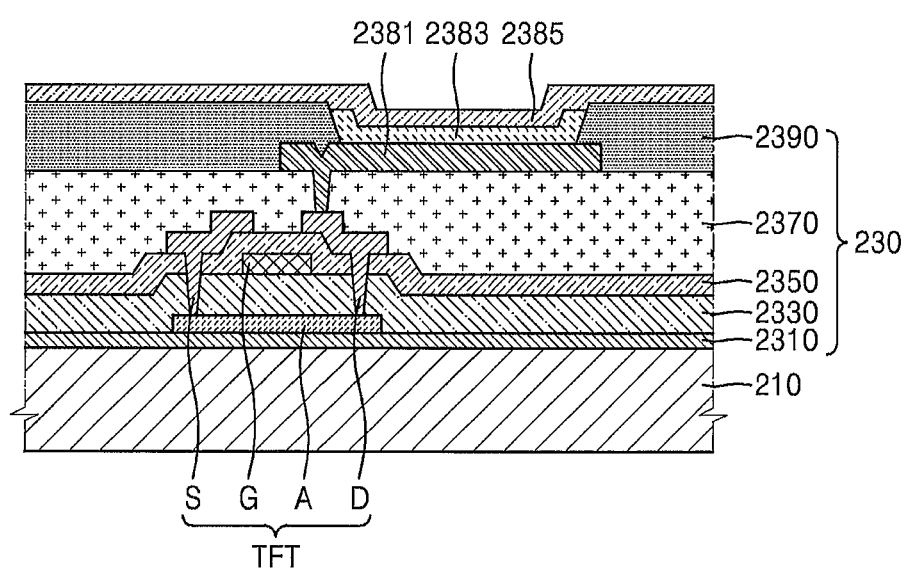
FIG. 2 illustrates a cross-sectional view of an OLED unit formed on a lower substrate.

FIG. 2 illustrates a cross-sectional view of the OLED unit 230 (hereinafter referred to as a display unit). A configuration of the display unit 230 will now be described in brief with reference to FIG. 2.

A buffer layer 2310 can be formed on the lower substrate 210. The buffer layer 2310 can prevent spread of impurity ions, prevent infiltration of moisture or external air, and act as a barrier layer for planarizing a surface and/or a blocking layer.

A semiconductor layer A of a thin-film transistor TFT is formed on the buffer layer 2310. The semiconductor layer A can be formed of polysilicon and can include a channel region that is not doped with impurities and source and drain regions that are doped with impurities at both sides of the channel region. The impurities can vary according to a type of the thin-film transistor TFT, e.g., N-type impurities or P-type impurities.

The semiconductor layer A can be formed of a semiconductor including amorphous silicon or crystalline silicon and can be deposited by various deposition methods. In this case, the crystalline silicon can be formed by crystallizing the amorphous silicon. There are various methods of crystalizing amorphous silicon, such as a rapid thermal annealing (RTA) method, a solid phase crystallization (SPC) method, an excimer laser annealing (ELA) method, a metal-induced crystallization (MIC) method, a metal-induced lateral crystallization (MILC) method, and a sequential lateral solidification (SLS) method. The semiconductor layer A can be patterned through a photolithography process.

A gate insulating layer 2330 is stacked completely on the lower substrate 210 such that the gate insulating layer 2330 covers the semiconductor layer A. The gate insulating layer 2330 can be a layer formed of an inorganic material such as silicon oxide or silicon nitride and formed in a multi-layer or single-layer structure. According to one or more embodiments, the gate insulating layer 2330 can be formed of silicon oxide ($SiO_2$), hafnium oxide, aluminum oxide, or the like. The gate insulating layer 2330 can be formed by various depositing methods such as chemical vapor deposition (CVD) and plasma-enhanced chemical vapor deposition (PECVD). The gate insulating layer 2330 insulates the semiconductor layer A from a gate electrode G.

The gate electrode G can be formed of at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), titanium (Ti), tungsten (W), and copper (Cu).

An interlayer insulating layer 2350 is formed over the lower substrate 210 such that the interlayer insulating layer 2350 covers the gate electrode G.

The interlayer insulating layer 2350 can be formed of an inorganic material or an organic material. According to one or more embodiments, the interlayer insulating layer 2350 is formed of an inorganic material. For example, the interlayer insulating layer 2350 is formed of metal oxide or metal nitride. For example, the inorganic material is silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The interlayer insulating layer 2350 can be a layer formed of inorganic materials such as $SiO_x$ and/or $SiN_x$ and formed in a single-layer or multi-layer structure. According to one or more embodiments, the interlayer insulating layer 2350 is formed in a double-layer structure of $SiO_x/SiN_y$ or $SiN_x/SiO_y$. The interlayer insulating layer 2350 can be formed by various deposition methods such as CVD and PECVD.

The interlayer insulating layer 2350 can insulate the gate electrode G from wirings formed on the interlayer insulating layer 2350.

A source electrode S and a drain electrode D of the thin-film transistor TFT are formed on the interlayer insulating layer 2350.

A planarization layer 2370 is formed all over the lower substrate 210 such that the planarization layer 2370 covers the source electrode S and the drain electrode D. A pixel electrode 2381 can be formed on the planarization layer 2370. The pixel electrode 2381 is connected to the drain electrode D of the thin-film transistor TFT through a via hole.

The planarization layer 2370 can be formed of an insulating material. For example, the planarization layer 2370 is formed of an inorganic material, an organic material, or an organic/inorganic complex, formed in a single-layer or a multi-layer structure, and by various deposition methods. According to one or more embodiments, the planarization layer 2370 is formed of one or more of polyacrylate resin, epoxy resin, phenolic resin, polyamide resin, polyimide resin, unsaturated polyester resin, poly-phenylenether resin, poly(phenylenesulfide) resin, and benzocyclobutene (BCB).

An OLED can be provided on the thin-film transistor TFT. The OLED includes the pixel electrode 2381, an intermediate layer 2383 including an organic emission layer, and an opposite electrode 2385. The OLED display can further include a pixel-defining layer 2390 and a spacer (not shown).

The pixel electrode 2381 can fill the via hole of the planarization layer 2370 and can be electrically connected to the drain electrode D. The pixel electrode 2381 and/or the opposite electrode 2385 can be a transparent electrode or a reflective electrode. When the pixel electrode 2381 and/or the opposite electrode 2385 are a transparent electrode, the pixel electrode 2381 and/or the opposite electrode 2385 can be formed of indium tin oxide (ITO), indium zinc oxide (IZO), zinc oxide (ZnO), or indium oxide ($In_2O_3$), and when the pixel electrode 2381 and/or the opposite electrode 2385 are a reflective electrode, the pixel electrode 2381 and/or the opposite electrode 2385 can be formed of a reflective layer formed of Ag, Mg, Al, Pt, Pd, Au, Ni, Nd, Ir, Cr, a compound thereof, or the like and a transparent layer formed of ITO, IZO, ZnO, or $In_2O_3$. According to one or more embodiments, the pixel electrode 2381 or the opposite electrode 2385 has an ITO/Ag/ITO structure.

The pixel-defining layer 2390 can define a pixel area and a non-pixel area. The pixel-defining layer 2390 can include an opening through which the pixel electrode 2381 is exposed and can be formed to substantially or completely cover the lower substrate 210. The intermediate layer 2383 can be formed in the opening, which is a substantial pixel area.

The pixel electrode 2381, the intermediate layer 2383, and the opposite electrode 2385 form the OLED. Holes and electrons respectively injected from the pixel electrode 2381 and the opposite electrode 2385 of the OLED can recombine in the organic emission layer, thereby emitting light.

The intermediate layer 2383 can include the organic emission layer. As another example, the intermediate layer 2383 includes the organic emission layer and further includes at least one of a hole injection layer (HIL), a hole transport layer (HTL), an emission layer (EML), an electron transport layer (ETL), and an electron injection layer (EIL). The present embodiment is not limited thereto, and the intermediate layer 2383 includes the organic emission layer and can further include other various function layers.

The HIL can be formed of a phthalocyanine compound, such as copper phthalocyanine, or a starburst-type amine derivative such as 4,4',4"-Tri(N-carbozolyl)triphenylamine (TCTA), 4,4',4"iTris(3-metholyphenyphenylamino)triphenylamine (m-MTDATA), or 1,3,5-tris[4-(3-methylphenylphenylamino)phenyl]benzene (m-MTDAPB).

The HTL can be formed of N-N'-bis(3-methylphenyl)-N-N'-diphenyl-[1-1-biphenyl]-4,4'-diamine (TPD), N,N-Di (naphthalenel-yl)-N,N'-diphenyl-benzidine (NPD), or the like.

The EIL can be formed of lithium fluoride (LiF), sodium chloride (NaCl), cesium fluoride (CsF), lithium oxide ($Li_2O$), barium oxide (BaO), or lithium quinolinate (Liq).

The ETL can be formed using $Liq_3$.

The organic emission layer can be formed of a host material and a dopant material. The host material of the organic emission layer can be tris(8-hydroxyquinolinate) aluminum ($Alq_3$), 9,10-di(naphth-2-yl)anthracene (AND), 3-tert-butyl-9,10-di (naphth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazole-9-yl)benzene (mCP), 1,3,5-tris(carbazole-9-yl)benzene (tCP), 4,4',4"-tris(carbazole-9-yl)triphenylamine (TcTa), 4,4'-bis(carbazole-9-yl)biphenyl (CBP), 4,4'-bis (9-carbazolyl)-2,2'-dimethyl-biphenyl (CBDP), 4,4'-bis (carbazole-9-yl)-9,9-dimethyl-fluorene (DMFL-CBP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The dopant material of the organic emission layer can be 4,4'-bis[4-(di-p-tolylamino)styryl]biphenyl (DPAVBi), 9,10-di(naph-2-thyl)anthracene (ADN), 3-tert-butyl-9,10-di (naph-2-thyl)anthracene (TBADN), or the like.

The opposite electrode 2385 is formed on the intermediate layer 2383. The opposite electrode 2385 forms an electric field together with the pixel electrode 2381 so that the intermediate layer 2383 emits light. The pixel electrode 2381 can be patterned for each pixel, and the opposite electrode 2385 can be formed such that a common voltage is applied to all pixels.

The pixel electrode 2381 and the opposite electrode 2385 can be a transparent electrode or a reflective electrode. The pixel electrode 2381 can function as an anode electrode, and the opposite electrode 2385 can function as a cathode electrode, However, the present embodiment is not limited thereto. For example, the pixel electrode 2381 functions as a cathode electrode, and the opposite electrode 2385 functions as an anode electrode.

Although FIG. 2 shows only one OLED, a display panel includes a matrix of OLEDs. Each OLED can emit a red, green, blue, or white color.

However, the present embodiment is not limited, thereto. The intermediate layer 2383 can be formed commonly for all pixel electrodes 2381. In this case, the organic emission layer can be formed, for example, by stacking vertically or mixing layers respectively including materials for emitting red, green, and blue lights. However, a combination of other colors is acceptable as long as white light is emitted. In addition, a color conversion layer for converting the emitted white color into a predetermined color or a color filter can be further included.

Figure 1C:
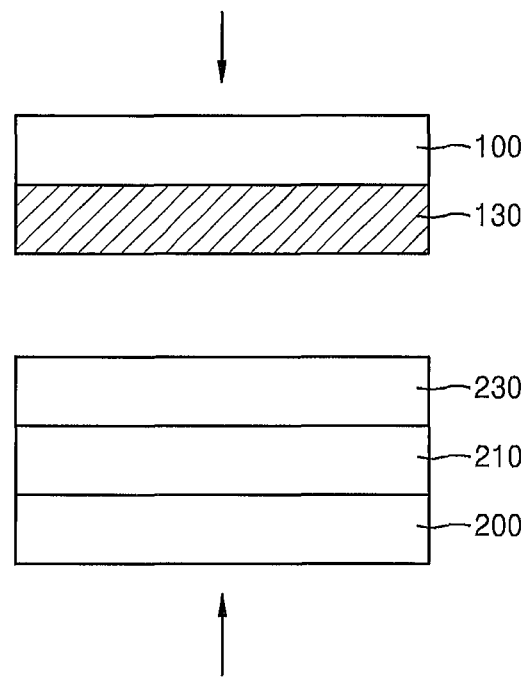

Referring to FIG. 1C, the donor glass 100, on which the barrier thin-film 130 is formed, and the acceptor glass 200, on which the OLED unit 230 is formed, are bonded to each other.

In this case, a bonding process can be performed by turning over the donor glass 100 and bringing the barrier thin-film 130 into contact with the OLED unit 230.

After aligning the donor glass 100 and the acceptor glass 200 together, the bonding process can be performed in a vacuum environment. The bonding process can be performed by adding an adhesive layer between the donor glass 100 and the acceptor glass 200. However, a processing method is not limited thereto. The bonding process can be performed in any environment as long as the donor glass 100 and the acceptor glass 200 are firmly bonded to each other.

Figure 1D:
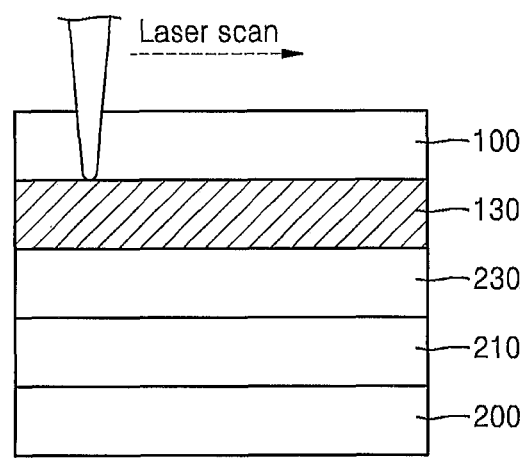
Figure 1E:
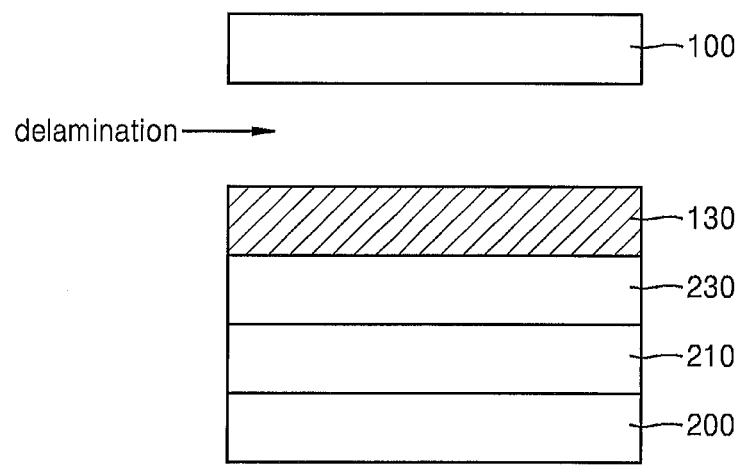

Referring to FIGS. 1D and 1E, the donor glass 100 is delaminated by irradiating a laser beam on the barrier thin-film 130.

That is, when a laser scans from left to right while irradiating a laser beam, delamination occurs between layers due to heat. Therefore, when a scan process of irradiating a laser beam on the barrier thin-film 130 is performed, the donor glass 100 can be delaminated from the barrier thin-film 130, as shown in FIG. 1E.

In this case, when a laser beam is irradiated, delamination occurs due to heat, but if the barrier thin-film 130 is formed on the OLED unit 230 and a laser beam is irradiated on the barrier thin-film 130, the OLED is not damaged.

Therefore, the OLED display manufactured by the method according to the present embodiment can include the barrier thin-film 130 for preventing infiltration of moisture/oxygen on the OLED unit 230 and exhibit both efficient moisture infiltration prevention and flexible characteristics with a high density, and a small thickness of the barrier thin-film 130 according to high-temperature evaporation of a material to form the barrier thin-film 130.

FIGS. 3A to 3E illustrate cross-sectional views for explaining a method of manufacturing an OLED display, according to another embodiment. In FIGS. 3A to 3E, like reference numerals in FIGS. 1A to 1E indicate like members, and descriptions thereof are omitted for convenience of description.

Figure 3A:
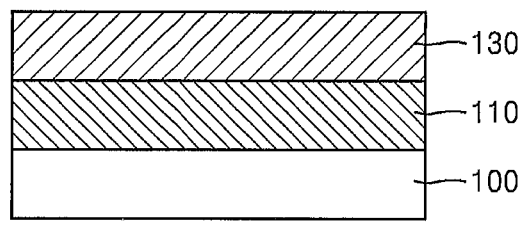
FIGS. 3A, 3B, 3C, 3D and 3E illustrate cross-sectional views for explaining a method of manufacturing an OLED display, according to another embodiment.

Referring to FIG. 3A, the donor glass 100 is prepared, and a sacrificial layer 110 is formed on the donor glass 100.

The sacrificial layer 110 can prevent the barrier thin-film 130 from being damaged in a process of delaminating the donor glass 100 from the barrier thin-film 130 thereafter. A process of delaminating the sacrificial layer 110 will be described in detail below.

Since a portion of the sacrificial layer 110 is delaminated by irradiating a laser beam thereto, the sacrificial layer 110 can be formed of a material that is disintegrated by heat that is applied during irradiation of a laser beam thereto.

In addition, since the barrier thin-film 130 formed on the sacrificial layer 110 can be formed in a high-temperature environment as described above, the sacrificial layer 110 can be formed of a material which is not disintegrated at a temperature at which the barrier thin-film 130 is formed.

That is, since the barrier thin-film 130 is formed by evaporation of a material in high-temperature environment of at most about 550° C., the sacrificial layer 110 can be formed of a material of which a melting point is about 550° C. or more.

The sacrificial layer 110 can be formed of an inorganic material containing hydrogen of about 4 wt % or more.

The sacrificial layer 110 can be formed as a thin film formed of hydrogen or a metal hydride material, such as a-Si:H or SiC:H, by CVD. For example, the sacrificial layer 110 is formed of $TiH_4$ or the like.

If the sacrificial layer 110 is formed of a material including hydrogen, when the sacrificial layer 110 absorbs a laser beam, the sacrificial layer 110 can be melted down and effuse hydrogen, and thus a portion of the sacrificial layer 110 can be delaminated.

Alternatively, the sacrificial layer 110 can be formed of an oxide ceramic material, such as zirconium silicon oxide $(ZrSiO_2)$, $MoO_x$, ZnO, IZO, or ITO, a dielectric material, and a semiconductor material.

Alternatively, the sacrificial layer 110 can be formed of a nitride ceramic material, such as $AlN_x$, $TiN_x$, or gallium nitride (GaN), a dielectric material, and a semiconductor material.

The barrier thin-film 130, formed by evaporation of a material at a high temperature, as described above, can be formed on the sacrificial layer 110. The barrier thin-film 130 according to the present embodiment has good moisture infiltration prevention efficiency with a high density and secures flexibility with a small thickness.

Figure 3B:
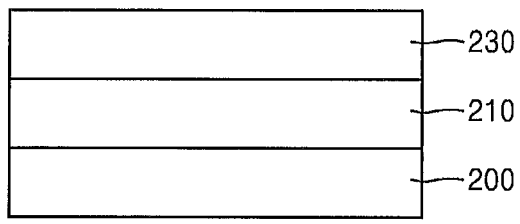

Referring to FIG. 3B, the lower substrate 210 is formed on the acceptor glass 200, and the OLED unit 230 can be formed on the lower substrate 210. Descriptions thereof are the same as described with reference to FIG. 1B and are thus omitted for convenience of description.

Figure 3C:
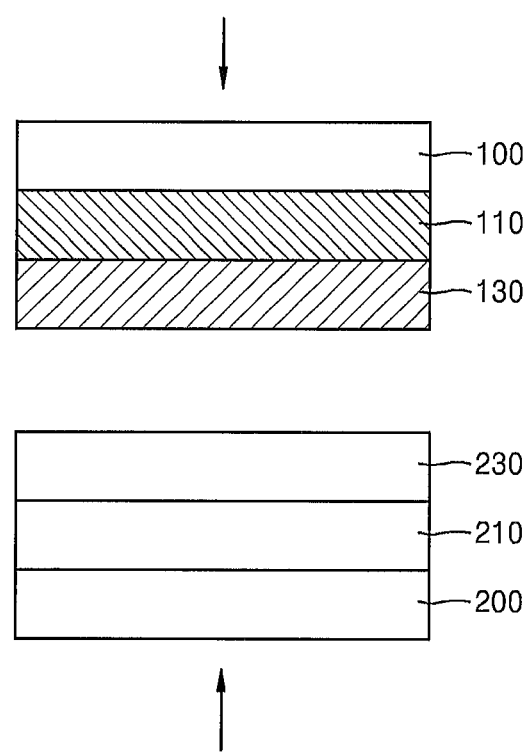

Referring to FIG. 3C, the donor glass 100, on which the sacrificial layer 110 and the barrier thin-film 130 are formed, and the acceptor glass 200, on which the OLED unit 230 is formed, are bonded to each other.

In this case, a bonding process can be performed by turning over the donor glass 100 and bringing the barrier thin-film 130 into contact with the OLED unit 230.

Descriptions of the process of bonding the donor glass 100 and the acceptor glass 200 to each other are the same as described with reference to FIG. 1C and are thus omitted for convenience of description.

Figure 3D:
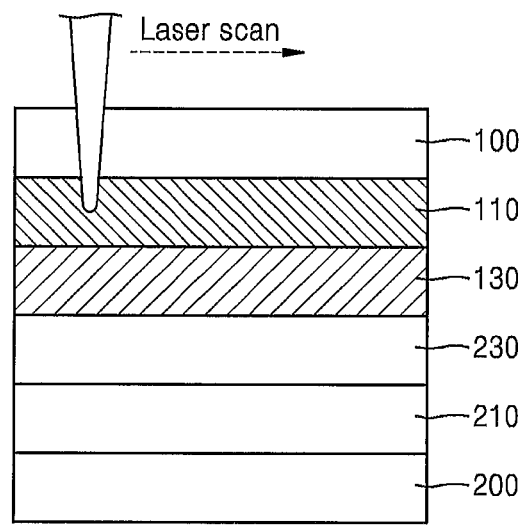
Figure 3E:
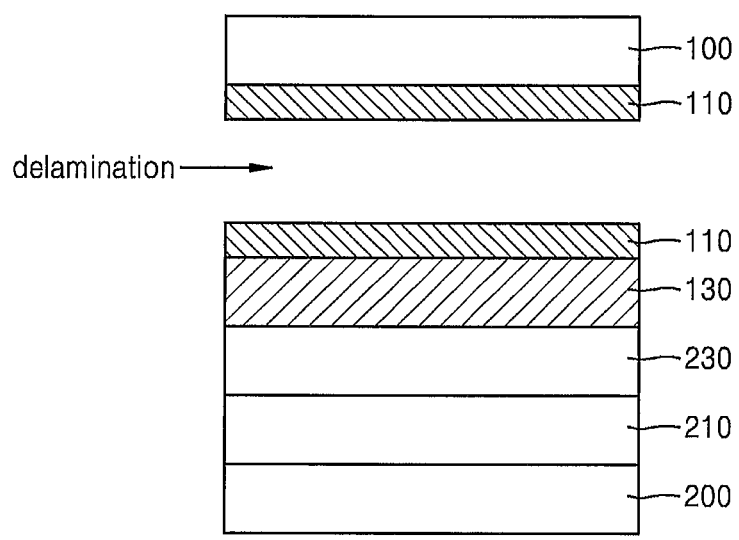

Referring to FIGS. 3D and 3E, the donor glass 100 is delaminated by irradiating a laser beam on the sacrificial layer 110.

That is, when a laser scans from left to right while irradiating a laser beam to the sacrificial layer 110, delamination occurs between layers due to heat. Therefore, when a scan process of irradiating a laser beam on the sacrificial layer 110 is performed, a portion of the sacrificial layer 110 and the donor glass 100 can be delaminated from the acceptor glass 200 due to segmentation of the sacrificial layer 110, as shown in FIG. 3E.

As described above, since the sacrificial layer 110 can be formed of a material which is disintegrated by heat when a laser beam is irradiated thereon, if a laser beam is irradiated on the sacrificial layer 110, the sacrificial layer 110 can be segmented.

In this case, when a laser beam is irradiated on the sacrificial layer 110, the sacrificial layer 110 is segmented, but the barrier thin-film 130 is formed on the OLED unit 230, and thus, even when the laser beam is irradiated on the barrier thin-film 130, the OLED is not damaged.

In addition, since the sacrificial layer 110 is segmented therein according to irradiation of a laser beam, the barrier thin-film 130 can also not be damaged by heat.

As a result, the OLED display manufactured by the method according to the present embodiment can include the barrier thin-film 130 for preventing infiltration of moisture/oxygen on the OLED unit 230 and exhibit both efficient moisture infiltration prevention and flexible characteristics with a high density and a small thickness of the barrier thin-film 130 according to high-temperature evaporation of a material to form the barrier thin-film 130.

FIGS. 4A to 4E illustrate cross-sectional views for explaining a method of manufacturing an OLED display, according to another embodiment. In FIGS. 4A to 4E, like reference numerals in FIGS. 3A to 3E indicate like members, and descriptions thereof are omitted for convenience of description.

Figure 4A:
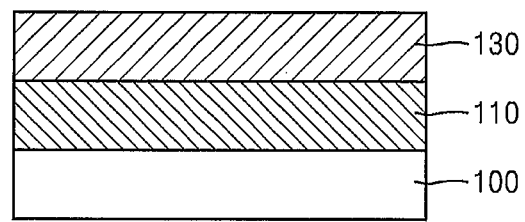
FIGS. 4A, 4B, 4C, 4D and 4E illustrate cross-sectional views for explaining a method of manufacturing an OLED display, according to another embodiment.

Referring to FIG. 4A, the sacrificial layer 110 and the barrier thin-film 130 are formed on the donor glass 100.

Figure 4B:
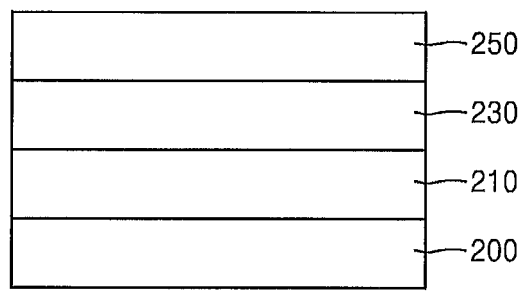

Referring to FIG. 4B, the lower substrate 210 and the OLED unit 230 are formed on the separate acceptor glass 200.

In addition, a protective layer 250 can be further formed on the OLED unit 230.

The protective layer 250 can be additionally provided to protect the OLED unit 230 from damage by external impact.

In some embodiments, the OLED unit 230 is protected by the barrier thin-film 130 and the sacrificial layer 110 and is not damaged in a laser beam irradiating process to be performed thereafter. In some embodiments, the OLED unit 230 is substantially prevented from being damaged by external impact by additionally forming the protective layer 250 according to the present embodiment.

The protective layer 250 can include an inorganic layer and/or an organic layer. However, a material forming the protective layer 250 is not limited thereto.

Figure 4C:
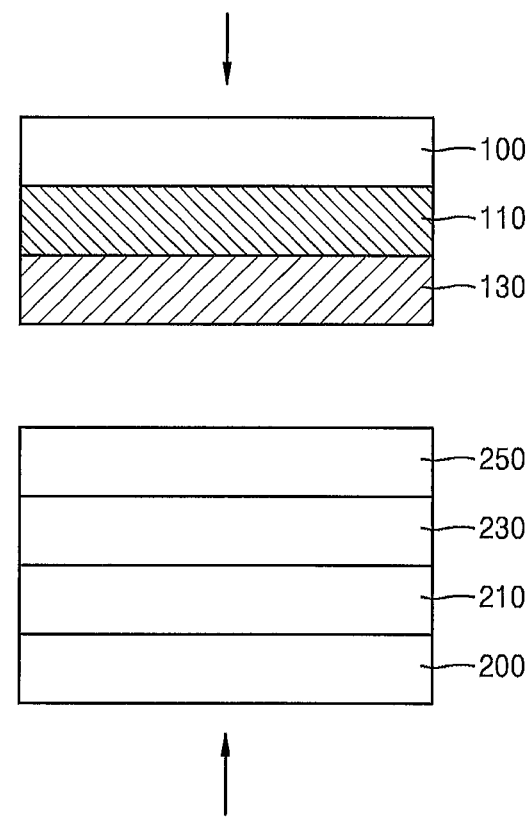

Referring to FIG. 4C, the donor glass 100, on which the sacrificial layer 110 and the barrier thin-film 130 are formed, and the acceptor glass 200, on which the OLED unit 230 is formed, are bonded to each other.

In this case, a bonding process can be performed by turning over the donor glass 100 and bringing the barrier thin-film 130 into contact with the protective layer 250.

Except for the difference that the protective layer 250 is additionally formed between the barrier thin-film 130 and the OLED unit 230, descriptions of the process of bonding the donor glass 100 and the acceptor glass 200 are the same as described with reference to FIG. 3C and are thus omitted for convenience of description.

Figure 4D:
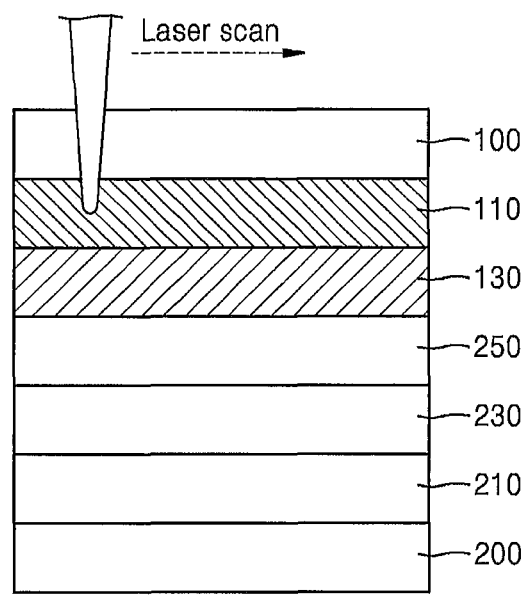
Figure 4E:
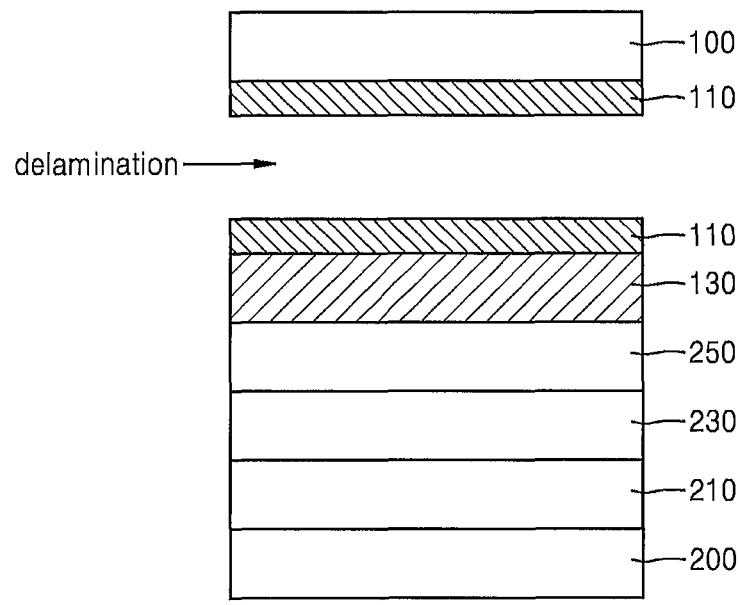

Referring to FIGS. 4D and 4E, the donor glass 100 is delaminated by irradiating a laser beam on the sacrificial layer 110.

That is, when a laser scans from left to right while irradiating a laser beam to the sacrificial layer 110, delamination occurs between layers due to heat. Therefore, when a scan process of irradiating a laser beam on the sacrificial layer 110 is performed, a portion of the sacrificial layer 110 and the donor glass 100 can be delaminated from the acceptor glass 200 due to segmentation of the sacrificial layer 110, as shown in FIG. 4E.

Figure 5:
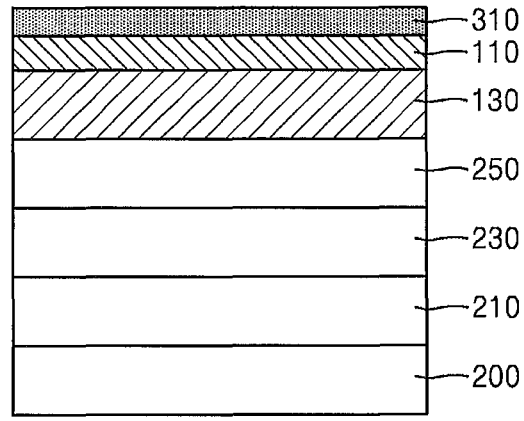
FIG. 5 illustrates a cross-sectional view for explaining one operation of a method of manufacturing an OLED display, according to an embodiment.

FIG. 5 illustrates a cross-sectional view for explaining one operation of a method of manufacturing an OLED display, according to an embodiment. The operation of FIG. 5 can be performed after the operation of FIG. 4E. In FIG. 5, like reference numerals in FIG. 4E indicate like members, and descriptions thereof are omitted for convenience of description.

In addition, even to the embodiments described with reference to FIGS. 1E and 3E, although the difference is that the sacrificial layer 110 or the protective layer 250 is not formed, the operation of FIG. 5 can be performed thereafter.

Referring to FIG. 5, after a portion of the sacrificial layer 110 and the donor glass 100 are delaminated by irradiating a laser beam on the sacrificial layer 110, an upper protective film 310 is attached to the remaining portion of the sacrificial layer 110.

This is to prevent any damage which can occur according to infiltration of moisture/oxygen, heat, or an impact from the outside in a process thereafter.

Figure 6A:
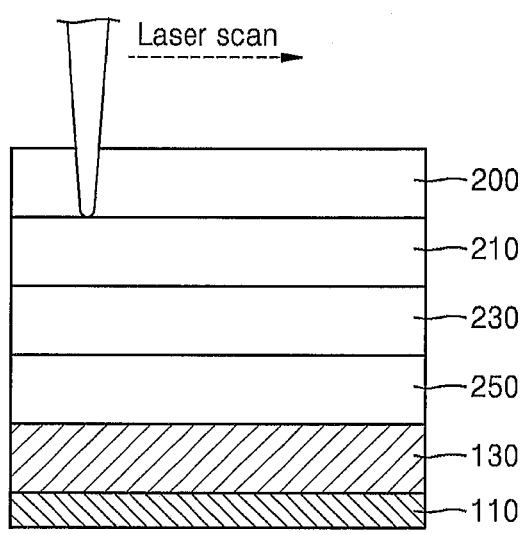
FIGS. 6A and 6B illustrate cross-sectional views for explaining operations of a method of manufacturing an OLED display, according to an embodiment.
Figure 6B:
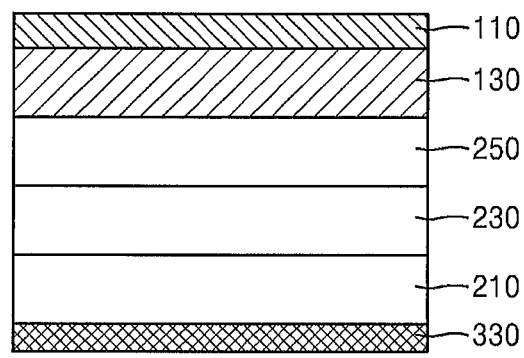

FIGS. 6A and 6B illustrate cross-sectional views for explaining operations of a method of manufacturing an OLED display, according to an embodiment. The operations shown in FIGS. 6A and 6B can be performed after the operation of FIG. 4E. In FIGS. 6A and 6B, like reference numerals in FIG. 4E indicate like members, and descriptions thereof are omitted for convenience of description.

In addition, even to the embodiments described with reference to FIGS. 1E and 3E, although the difference is that the sacrificial layer 110 or the protective layer 250 is not formed, the operations of FIGS. 6A and 6B can be performed thereafter.

Referring to FIG. 6A, after a portion of the sacrificial layer 110 and the donor glass 100 are delaminated, the acceptor glass 200 is turned over.

For the overturned acceptor glass 200, the acceptor glass 200 can be delaminated by irradiating a laser beam between the acceptor glass 200 and the lower substrate 210.

As described above, in some embodiments, since the lower substrate 210 can be formed of a material having strong heat-resistance characteristics, such as PI, the lower substrate 210 is not damaged even though heat is applied to the lower substrate 210 by irradiating a laser beam thereon.

Referring to FIG. 6B, after delaminating the acceptor glass 200, a lower protective film 330 is attached below the lower substrate 210.

The lower protective film 330 prevents infiltration of external moisture or oxygen from the bottom.

Figure 7:
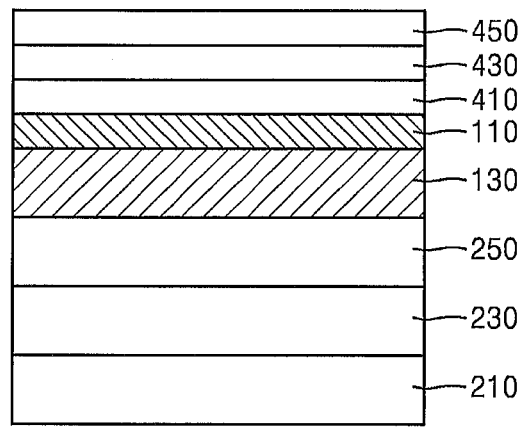
FIG. 7 illustrates a cross-sectional view of an OLED display manufactured by a method of manufacturing the OLED display, according to an embodiment.

FIG. 7 illustrates a cross-sectional view of an OLED display manufactured by a method of manufacturing the OLED display, according to an embodiment.

The OLED unit 230 and the protective layer 250 can be sequentially formed on the lower substrate 210, and the separately formed barrier thin-film 130 can be bonded to the protective layer 250.

Since the barrier thin-film 130 is formed separately by evaporating a material in a high-temperature environment and is placed on the protective layer 250, the barrier thin-film 130 can be formed with a high density and a small thickness.

A portion of the sacrificial layer 110, which has remained in a laser beam irradiating process, can exist on the barrier thin-film 130.

A pol film or polarizing film 410, a touch screen panel (TSP) 430, a window 450, and the like can be sequentially stacked and formed on the barrier thin-film 130 and the remaining portion of the sacrificial layer 110.

However, the structure formed on the barrier thin-film 130 and the remaining portion of the sacrificial layer 110 can vary according to circumstances and is not limited thereto.

Figure 8:
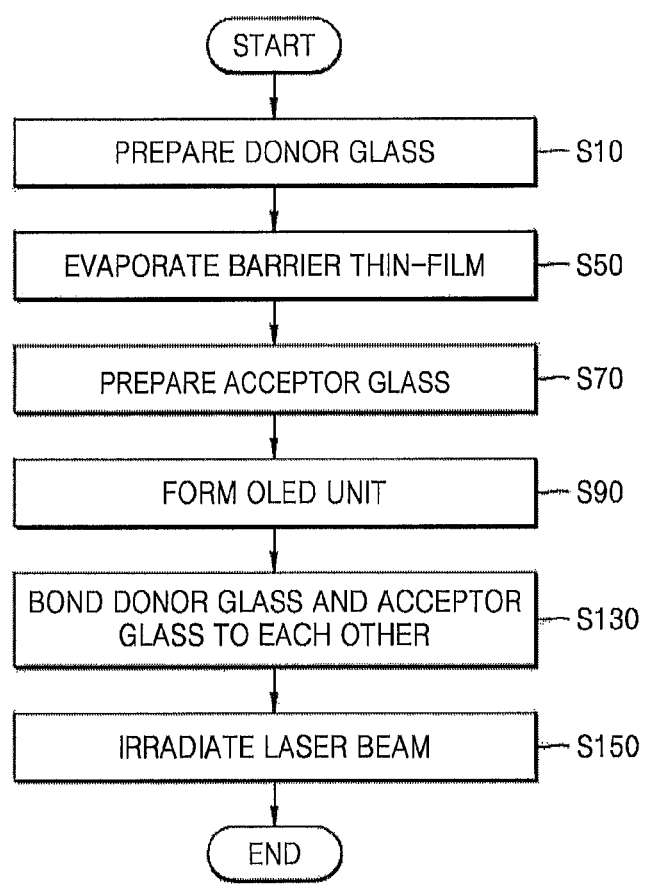
FIG. 8 illustrates a flowchart of a method of manufacturing an OLED display, according to an embodiment.

FIG. 8 illustrates a flowchart of a method of manufacturing an OLED display, according to an embodiment. In each operation, like reference numerals indicate like components, and thus, descriptions thereof are omitted for convenience of description. Depending on embodiments, additional states may be added, others removed, or the order of the states changed in the procedure of FIG. 8. This applies to the remaining method embodiments.

The method according to the present embodiment will now be sequentially described with reference to FIGS. 1A to 8.

In operation S10, the donor glass 100 is prepared, and in operation S50, the barrier thin-film 130 is formed by evaporating a material on the donor glass 100.

As described above, operation S50 can be performed in a high-temperature environment, and accordingly, the barrier thin-film 130 having a good moisture infiltration prevention effect because of high density and having good flexibility because of small thickness can be formed.

In operation S70, the separate acceptor glass 200 is prepared, and the lower substrate 210 can be formed on the acceptor glass 200.

In operation S90, the OLED unit 230 is formed on the lower substrate 210, and in operation S130, the donor glass 100 is turned over and is bonded to the acceptor glass 200.

In this case, the barrier thin-film 130 of the donor glass 100 can be bonded to the OLED unit 230 of the acceptor glass 200.

In operation 150, a laser beam is irradiated between the donor glass 100 and the barrier thin-film 130 to delaminate the donor glass 100.

Figure 9:
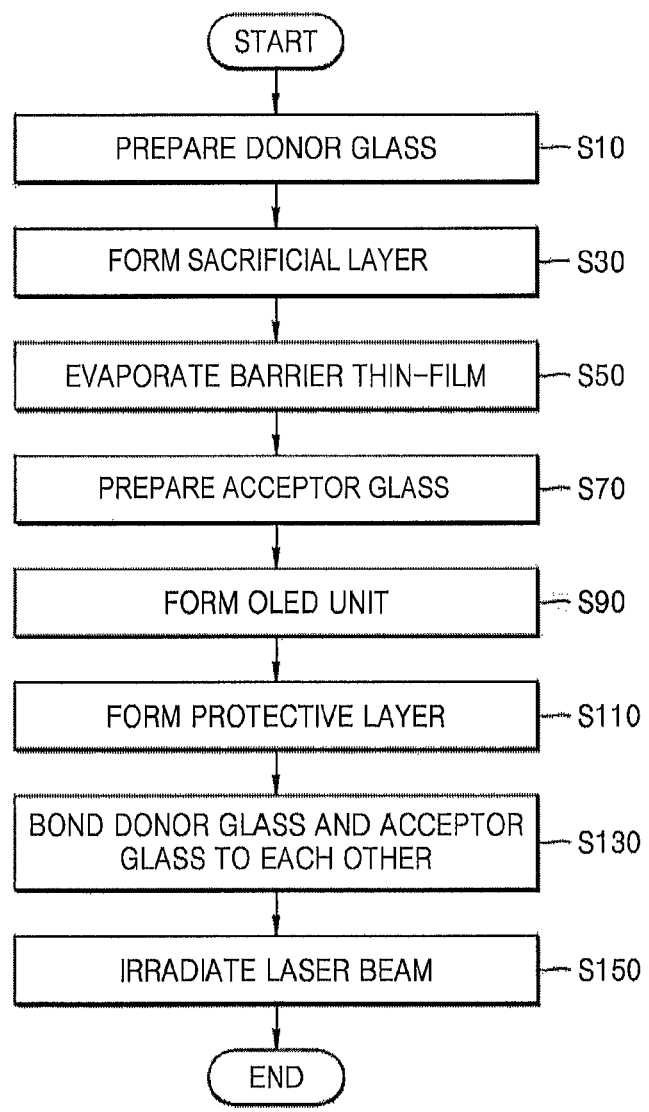
FIG. 9 illustrates a flowchart of a method of manufacturing an OLED display, according to another embodiment.

FIG. 9 illustrates a flowchart of a method of manufacturing an OLED display, according to another embodiment. In each operation, like reference numerals indicate like components, and thus, descriptions thereof are omitted for convenience of description.

The method according to the present embodiment will now be sequentially described with reference to FIGS. 1A to 9.

In operation S10, the donor glass 100 is prepared, and in operation S30, the sacrificial layer 110 is formed on the donor glass 100. The sacrificial layer 110 protects the barrier thin-film 130 in a process of delaminating the donor glass 100 thereafter. Accordingly, damage to the barrier thin-film 130 can be reduced.

In operation S50, a material for forming the barrier thin-film 130 is evaporated on the sacrificial layer 110 after forming the sacrificial layer 110.

As described above, operation S50 can be performed in a high-temperature environment, and accordingly, the barrier thin-film 130 having a good moisture infiltration prevention effect because of high density and having good flexibility because of small thickness can be formed.

In operation S70, the separate acceptor glass 200 is prepared, and the lower substrate 210 can be formed on the acceptor glass 200.

In operation S90, the OLED unit 230 is formed on the lower substrate 210, and in operation S110, the protective layer 250 is formed on the OLED unit 230.

Operation S110 is performed to prevent the OLED unit 230 from being damaged by heat applied in a laser beam irradiating process or external impact.

After forming the protective layer 250 in operation S110, in operation S130, the donor glass 100 is turned over and is bonded to the acceptor glass 200.

In this case, the barrier thin-film 130 of the donor glass 100 can be bonded to the protective layer 250 of the acceptor glass 200.

In operation 150, a laser beam is irradiated on the sacrificial layer 110.

The sacrificial layer 110 can be disintegrated by heat applied by an irradiated laser beam, and the donor glass 100 and a portion of the sacrificial layer 110 can be delaminated.

Figure 10:
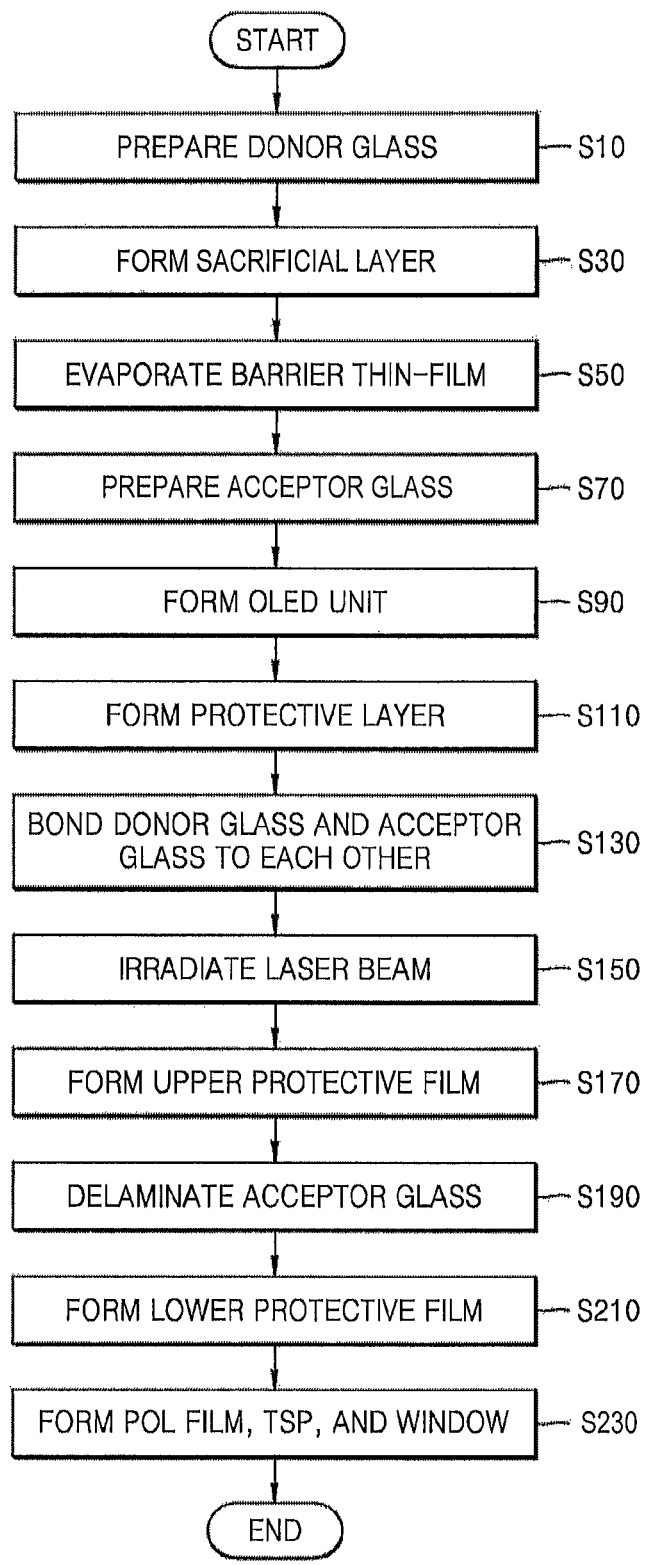
FIG. 10 illustrates a flowchart of a method of manufacturing an OLED display, according to another embodiment.

FIG. 10 illustrates a flowchart of a method of manufacturing an OLED display, according to another embodiment.

Operations S10 to S150 in the method according to the present embodiment are the same as those in the method of FIG. 9, and thus, descriptions thereof are omitted for convenience of description, and operations thereafter will be described.

After delaminating the donor glass 100 and a portion of the sacrificial layer 110 in operation S150, in operation S170, the upper protective film 310 is formed on the remaining portion of the sacrificial layer 110.

The upper protective film 310 can be formed to prevent the OLED unit 230 from being damaged by external moisture, oxygen, heat, or impact during a process thereafter.

In operation S190, the acceptor glass 200 is turned over and is delaminated by irradiating a laser beam thereto.

That is, the acceptor glass 200 can be delaminated by heat by irradiating a laser beam between the acceptor glass 200 and the lower substrate 210.

In operation S210, the lower protective film 330 is formed below the lower substrate 210 after delaminating the acceptor glass 200.

The lower protective film 330 can prevent infiltration of external moisture or oxygen from the bottom of the lower substrate 210.

In operation S230, components such as the pol film 410, the TSP 430, and the window 450 are formed on the barrier thin-film 130 after removing the formed upper protective film 310. However, the components formed on the barrier thin-film 130 are not limited thereto, and components for performing various functions can be formed instead according to circumstances.

As described above, according to at least one of the disclosed embodiments, a barrier thin-film layer is formed by evaporating a material in a high-temperature process, thereby forming a high-density layer. Accordingly, even though the barrier thin-film has a small thickness, the barrier thin-film has a good moisture infiltration prevention effect, thereby maintaining its flexible characteristics.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details can be made therein without departing from the spirit and scope as defined by the following claims.

What is claimed is:

1. A method of manufacturing an organic light-emitting diode (OLED) display, the method comprising:
   providing a donor substrate;
   forming a sacrificial layer over the donor substrate, wherein the sacrificial layer has upper and lower portions, wherein the upper portion of the sacrificial layer contacts the donor substrate;
forming a barrier thin-film on the sacrificial layer at a first temperature;
providing an acceptor substrate and a substrate attached to the acceptor substrate;
forming an OLED unit over the substrate below a second temperature;
bonding the OLED unit and the barrier thin-film together;
irradiating a laser beam to the sacrificial layer so as to delaminate the upper portion of the sacrificial layer from the lower portion of the sacrificial layer, wherein the first temperature is higher than the second temperature,
attaching an upper protective film on the lower portion of the sacrificial layer after the irradiating;
removing the upper protective film from the lower portion of the sacrificial layer; and
attaching a polarizing film, a touch screen panel (TSP), and a window onto the lower portion of the sacrificial layer.

2. The method of claim 1, wherein the sacrificial layer is formed of a material which is not disintegrated at a temperature of about 550° C. or less.

3. The method of claim 1, wherein the sacrificial layer is formed of an inorganic material including hydrogen of about 4 wt % or more.

4. The method of claim 1, wherein the sacrificial layer is formed of an oxide, a nitride, a dielectric, or a semiconductor.

5. The method of claim 1, wherein the barrier thin-film has a thickness substantially the same as the sacrificial layer.

6. The method of claim 1, wherein the barrier thin-film includes an inorganic single layer, an inorganic multi-layer, or an organic and inorganic multi-layer.

7. The method of claim 1, further comprising forming a buffer layer over the OLED unit after forming the OLED unit over the substrate.

8. The method of claim 1, further comprising irradiating a laser beam on the substrate so as to delaminate the acceptor substrate from the substrate after delaminating the upper portion of the sacrificial layer from the lower portion of the sacrificial layer.

9. The method of claim 8, further comprising attaching a protective film to the substrate after delaminating the acceptor substrate.

10. The method of claim 1, wherein the bonding includes aligning the donor substrate to the acceptor substrate and performing the bonding in a vacuum environment.

11. A method of manufacturing an organic light-emitting diode (OLED) display, the method comprising:
providing a donor substrate;
forming a sacrificial layer over the donor substrate, wherein the sacrificial layer has upper and lower portions, wherein the upper portion of the sacrificial layer contacts the donor substrate;
forming a barrier thin-film on the sacrificial layer at a first temperature so as to form a donor portion;
attaching an intermediate substrate to an acceptor substrate so as to form an acceptor portion;
forming an OLED unit over the intermediate substrate below a second temperature;
bonding the OLED unit and the barrier thin-film together so as to attach the acceptor portion to the donor portion;
delaminating the upper portion of the sacrificial layer from the lower portion of the sacrificial layer, wherein the first temperature is higher than the second temperature;
attaching an upper protective film on the lower portion of the sacrificial layer after the delaminating;
removing the upper protective film from the lower portion of the sacrificial layer; and
attaching a polarizing film, a touch screen panel (TSP), and a window onto the lower portion of the sacrificial layer.

12. The method of claim 11, further comprising irradiating a laser beam on the intermediate substrate so as to delaminate the acceptor substrate from the intermediate substrate after delaminating the upper portion of the sacrificial layer from the lower portion of the sacrificial layer.

13. The method of claim 12, further comprising attaching a lower protective film to the intermediate substrate after delaminating the acceptor substrate.

14. The method of claim 11, wherein the bonding includes aligning the donor substrate to the acceptor substrate and performing the bonding in a vacuum environment.

* * * * *